(12) United States Patent
Harn

(10) Patent No.: US 6,668,365 B2
(45) Date of Patent: Dec. 23, 2003

(54) QUADRATIC PROGRAMMING METHOD FOR ELIMINATING CELL OVERLAP AND ROUTING CONGESTION IN AN IC LAYOUT

(75) Inventor: Ywh-Pyng Harn, Milpitas, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 10/225,255

(22) Filed: Aug. 20, 2002

(65) Prior Publication Data

US 2003/0182649 A1 Sep. 25, 2003

Related U.S. Application Data

(60) Provisional application No. 60/342,011, filed on Dec. 18, 2001.

(51) Int. Cl.[7] .............................. G06F 17/50; G06F 9/45
(52) U.S. Cl. ................................... 716/10; 716/7; 716/2
(58) Field of Search .............................. 716/8, 9, 2, 7, 716/10, 13, 14, 15; 711/147; 703/1; 700/121

(56) References Cited

U.S. PATENT DOCUMENTS 6,155,725 A  * 12/2000  Scepanovic et al. ........... 716/9
6,223,332 B1 *  4/2001  Scepanovic et al. .......... 716/10
6,249,902 B1 *  6/2001  Igusa et al. .................. 716/10

* cited by examiner

Primary Examiner—Leigh M. Garbowski
Assistant Examiner—Helen Rossoshek
(74) Attorney, Agent, or Firm—Daniel J. Bedell; Smith-Hill and Bedell

(57) ABSTRACT

To help eliminate overlapping cell placements or to reduce routing congestion in an IC layout wherein cells are integer multiples of a standard size cell unit, the layout is organized into an array of rectangular blocks, each having capacity to accommodate several cell units. A separate equation is established for each block relating a sum of a set of flow variables to an "overflow factor". Each flow variable of the equation for each block corresponds to a separate one of that block's neighboring blocks and represents an estimated number of cell units that must be moved to or received from the corresponding neighboring block to eliminate overlapping cell placements or routing congestion within the block. The overflow factor for each block represents an estimated total number of cell units the block must pass into its neighboring blocks or an estimated maximum number of cell units it may receive from its neighboring blocks in order to eliminate cell overlap or routing congestion in all blocks. A solution to the set of equations is then selected to obtain values of flow variables which, when subsequently used to guide cell relocation, substantially reduces likelihood of cell overlap or routing congestion while substantially minimizing disturbance to the layout.

36 Claims, 5 Drawing Sheets

| B 1,2 |
|---|
| B 1,1 |

FIG. 11

| B 1,2 | B 2,2 |
|---|---|
| B 1,1 | B 2,1 |

FIG. 12

| B 1,4 | B 2,4 |
|---|---|
| B 1,3 | B 23 |
| B 1,2 | B 2,2 |
| B 1,1 | B 2,1 |

FIG. 13

| B 1,4 | B 2,4 | B 3,4 | B 4,4 |
|---|---|---|---|
| B 1,3 | B 23 | B 3,3 | B 4,3 |
| B 1,2 | B 2,2 | B 3,2 | B 4,2 |
| B 1,1 | B 2,1 | B 3,1 | B 4,1 |

FIG. 14

QUADRATIC PROGRAMMING METHOD FOR ELIMINATING CELL OVERLAP AND ROUTING CONGESTION IN AN IC LAYOUT

CROSS-REFERENCE TO RELATED APPLICATIONS

The present application claims the benefit of the filing date of U.S. Provisional Application No. 60/342,011, filed Dec. 18, 2001.

BACKGROUND OF THE INVENTION

1. Field of the Invention

The present invention relates in general to computer-aided design tools for generating IC layouts and in particular to a method for eliminating cell overlap and routing congestion in an IC layout.

2. Description of Related Art

FIG. 1 illustrates a typical integrated circuit (IC) design process flow. An IC designer usually begins the IC design process by producing a register transfer language (RTL) "netlist" 10, a file describing the IC circuit as a set of nets (signal paths) interconnecting terminals of the various circuit devices ("cells") to be included in the IC. In a high level RTL netlist cells may be described in terms of the logic they carry out, using Boolean expressions to define logical relationships between device input and output signals. After employing circuit simulation and verification tools 11 to check the logic of the IC described by RTL level netlist 10, the designer uses a synthesis tool 12 to convert RTL level netlist 10 into a "gate level" netlist 14 describing each cell by referring to an entry for that cell in a cell library 13, which includes an entry for each cell that may be incorporated into an IC design. Cells described by cell library 13 may range from very small devices such as individual transistors, to small components such as logic gate formed by several transistors, up to very large components such as computer processors and memories.

The cell library entry for each cell contains a model of the time-dependent behavior of the cell that can be used to represent the cell when a gate level netlist 14 incorporating the cell into an IC design is subjected to simulation and verification 11. A simulation based on gate level netlist 14 more accurately predicts the behavior of the IC than a simulation based on RTL level netlist 10. However since the gate level netlist 14 does not model the networks interconnecting the cells, the simulation and verification results at this stage of the design do not take into account signal path delays in the nets.

After verifying the behavior of the circuit described by gate level netlist 14, the circuit designer employs computer-aided placement and routing (P&R) tools 16 to convert gate level netlist 14 into an IC layout describing how each cell is to be formed and positioned within a semiconductor substrate and describing how the nets interconnecting the cells are to be routed. The cell library entry for each cell also contains a detailed description of the cell's layout telling the P&R tools 16 how to lay out that cell. The P&R tools determine where to place each cell and how to orient each cell in the substrate and also determine how to route the nets that interconnect the cells.

As P&R tools 16 create an IC layout, a "netlist updater" 20 updates the gate level netlist 14 to produce a "layout level" netlist 22 not only models the cells forming the IC but also models the signal path delays within the nets interconnecting the cells. After P&R tools 16 have generated layout 18, the designer may again use simulation and verification tools 11 to verify the behavior of the circuit based on the more accurate layout level netlist 22 before sending the completed IC layout 18 to an IC manufacturer.

Placement and Routing

FIG. 2 illustrates a typical example of an iterative placement and routing process carried out at step 16 of FIG. 1. The designer may initially create a floor plan (step 24) for the layout when particular areas of the semiconductor substrate are to be reserved for particular cells. A P&R tool then develops a placement plan (step 26) indicating where each cell referenced by gate level netlist 14 is to be placed and how it is to be oriented within a semiconductor substrate in a manner consistent with the floor plan. Thereafter the P&R tool develops a routing plan (step 28) describing the paths followed by the nets interconnecting cell terminals. The placement and routing steps 26 and 28 are iterative in that when the P&R tool is unable to develop a routing plan at step 28 providing a suitable route for every net of the design, it returns to step 26 to reposition the cells and then attempts to develop a suitable routing plan for the altered placement plan at step 28.

Within most digital ICs, signals pass between blocks of logic through clocked devices such as registers and flip-flops so that the clock signals clocking those devices can synchronize the timing with which the logic blocks pass signals to one another. The logic blocks are therefore subject to timing constraints in that they must be able to process their input signals to produce their output signals within the period between clock signal edges. The time required for a logic block to process its input signals is a function of the processing speed of each cell within the logic block involved in the signal processing, and is also a function of the signal path delays through the various nets interconnecting those cells. Although the placement and routing tools may find space in the layout for all cells and for all of the nets interconnecting them at steps 26 and 28, the path delays through some of the logic blocks may fail to meet timing constraints.

Thus after the P&R tools have established placement and routing plans at steps 26 and 28, it is necessary to verify that all logic blocks meet their timing constraints. To do so, an "RC extraction tool" initially processes routing plan (step 30) to determine resistances and capacitances of the various sections of nets described by the routing plan and passes that information to a timing analysis tool. Since the path delay through a net is a function of its resistance and capacitance (path inductance is usually neglected) the timing analysis tool (at step 32) is able to compute path delays through the various nets based on the resistance and capacitance information provided by the RC extraction tool. The timing analysis tool also consults the cell library to determine the path delay through each cell of interest.

Based on the information provided by the timing analysis tool, the placement and routing plans are subjected to an "in place optimization" process (step 34) in which the path delays through the various logic blocks are analyzed to determine whether they meet their timing constraints. When a logic block fails to meet a timing constraint, the placement plan can be incrementally modified (step 35) by inserting buffers in signal paths to reduce path delays or by moving cells of the logic block closer together or resizing cells to reduce path delays between the cells. The routing plan is then altered (step 28) as necessary to accommodate the altered placement plan. The RC extraction process (step 30)

and the timing analysis process (step 32) may also be repeated. The process iterates through steps 28, 30, 32, 34 and 35 until placement and routing plans satisfying all timing constraints are established.

The layout process may also include a step of checking the layout for various signal integrity problems (step 36) including, for example, static timing analysis and cross-talk analysis, and may iteratively modify the placement and routing plans at step 35 to resolve these problems.

A clock tree synthesis tool may also be employed to design one or more clock trees (step 37) for the IC. A clock tree is a network of buffers for distributing a clock signal to the various registers, flip-flops and other clocked circuit devices. The clock tree design specifies a position for each buffer forming the clock tree and the routing paths interconnecting the buffers that will ensure that each clock signal edge arrives all clocked devices at substantially the same time. After the clock tree has been designed, the placement and routing plans are modified (steps 35 and 28) as necessary to incorporate the buffers and nets forming the clock tree into the layout.

A power analysis step 39 may also be carried out in which the layout is analyzed to determine whether power loads are adequately distributed throughout the power distribution network that delivers power to all cells.

When the layout process is unable to produce a layout based on gate level netlist 14 that satisfies all constraints, it may be necessary at step 40 to restructure the logic of the IC design (i.e. to modify gate level netlist 14) and then repeat the entire placement and routing process.

Cell Overlap

As may be seen from the above discussion, the placement and routing plans may be incrementally modified many times at steps 35 and 28 following in place optimization, clock tree synthesis, and power analysis steps in which cells may be added to the design. A placement plan can also be modified when there is a change to an IC design, for example when the designer wants to make a global change to a particular kind of cell having instances appearing in several parts of the layout or when the designer wants to incorporate additional cells into the layout, for example in response to an engineering change order.

Whenever the cells are to be added to a layout or increased in size, a cell overlap problem can arise. For example clock tree synthesis step 37 generates a clock tree design specifying that buffer cells are to be added at particular points within the layout, and when the P&R tool modifies the layout at step 35 to place the buffer cells at the specified points, it may have to relocate cells already residing at those points. This may not significantly alter the layout when vacant positions are available near the points of interest, but when areas of the layout surrounding the points of interest are so densely packed with cells that nearby vacant positions are not available, it may be necessary for the P&R tool to reposition a large number of cells in order to accommodate the new buffer cells. Similar cell overlap problems can arise when global replacements affect the size or aspect ratio of various types of cells.

When we modify a layout that already satisfies various design criteria, the modification may cause the layout to violate the design criteria. For example, when clock tree synthesis step 37 occurs after in-place optimization step 34, the modifications to the layout needed to accommodate the clock tree can spoil the layout's ability to meet design criteria that were satisfied during the in-place optimization step. Since the likelihood of such an unfortunate effect occurring as a result of a modification to a layout increases with the severity of the modification, it is helpful when repositioning cells to eliminate cell overlap to do so in a manner that minimizes the disturbance to the layout with respect to the number of cells that must be repositioned and the distance the cells are moved. Thus what is needed is a method that can help a P&R tool to determine how to reposition cells to eliminate cell overlap in a manner that substantially minimizes the disturbance to the layout.

Routing Congestion

As discussed above a conventional placement and routing tool initially creates a placement plan (step 26) specifying the position and orientation of each cell and then creates a routing plan (step 28) specifying the manner in which the nets interconnecting the cells are routed. During the process of creating the routing plan various areas of the layout can become too congested with nets to accommodate all of the nets that must pass through them. When that happens, the P&R tool must return to step 26, revise the placement plan by repositioning cells in a manner that eliminates routing congestion and then try again at step 28 to develop a suitable routing plan. What is needed is a method that can help the P&R tool to determine how to revise a placement plan with a routing congested layout so as to substantially increase the routability of the layout.

BRIEF SUMMARY OF THE INVENTION

The invention relates to a method for determining how to reposition cells within an IC layout either to eliminate cell overlap or routing congestion.

In accordance with the invention, the layout is initially organized into an array of blocks, each having capacity to hold several cell units wherein a cell unit spans a unit of substrate area of standard dimensions. A separate equation is established for each block relating a sum of a set of flow variables to an "overflow factor". Each flow variable of the equation for each block corresponds to a separate one of that block's neighboring blocks, and represents an estimated number of cell units that are to be moved to or received from the corresponding neighboring block to eliminate overlapping cell placements or routing congestion within the block. The overflow factor for each block represents an estimated total number of cells the block must pass to its neighboring blocks or a maximum number of cells it may receive from its neighboring blocks in order to eliminate cell overlap or routing congestion in all blocks.

Although many solutions to the set of simultaneous equations are possible, the method preferably searches for and selects the solution that minimizes a sum of squares of the flow variable values of all equations. This particular solution to the set of equations provides flow variable values which, when subsequently used to guide cell relocation, substantially reduces the likelihood of cell overlap or routing congestion while substantially minimizing disturbance to the layout.

The layout is then modified by moving cells between neighboring blocks wherein the total number of cell units moved between each pair of neighboring blocks and the direction in which they are moved is guided by the flow variable values provided by the selected solution.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

BRIEF DESCRIPTION OF THE DRAWINGS

FIGS. 11–14 represent successive stages of an IC placement generated by the placement algorithm of FIG. 10.

DETAILED DESCRIPTION OF THE INVENTION

Figure 1:
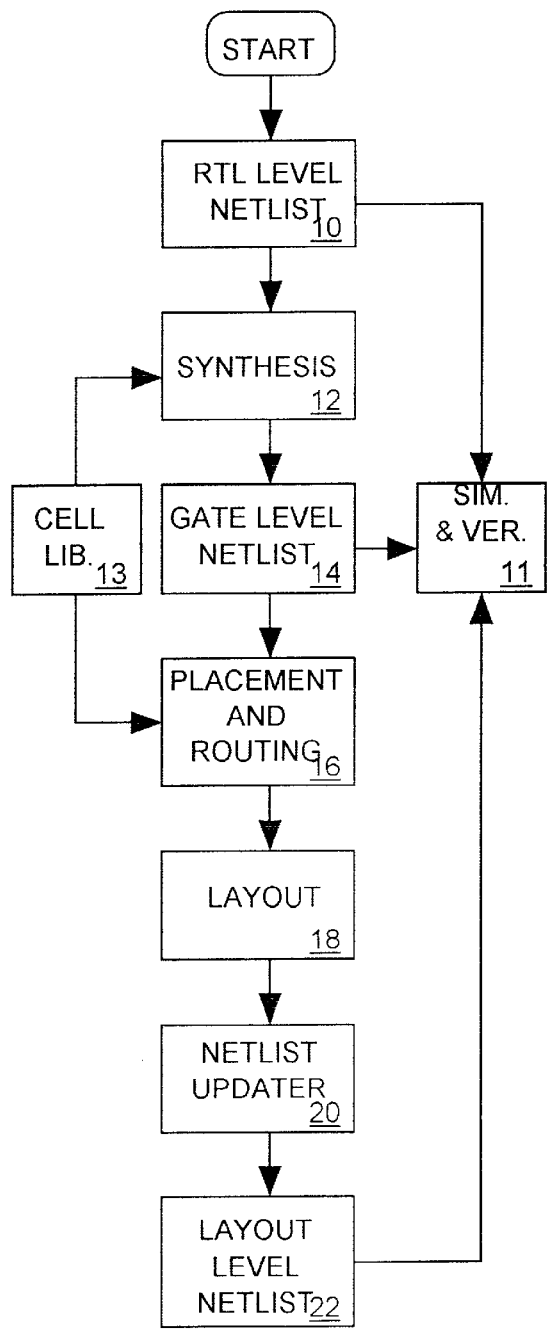
FIG. 1 is a flow chart illustrating a prior art IC design process.
Figure 2:
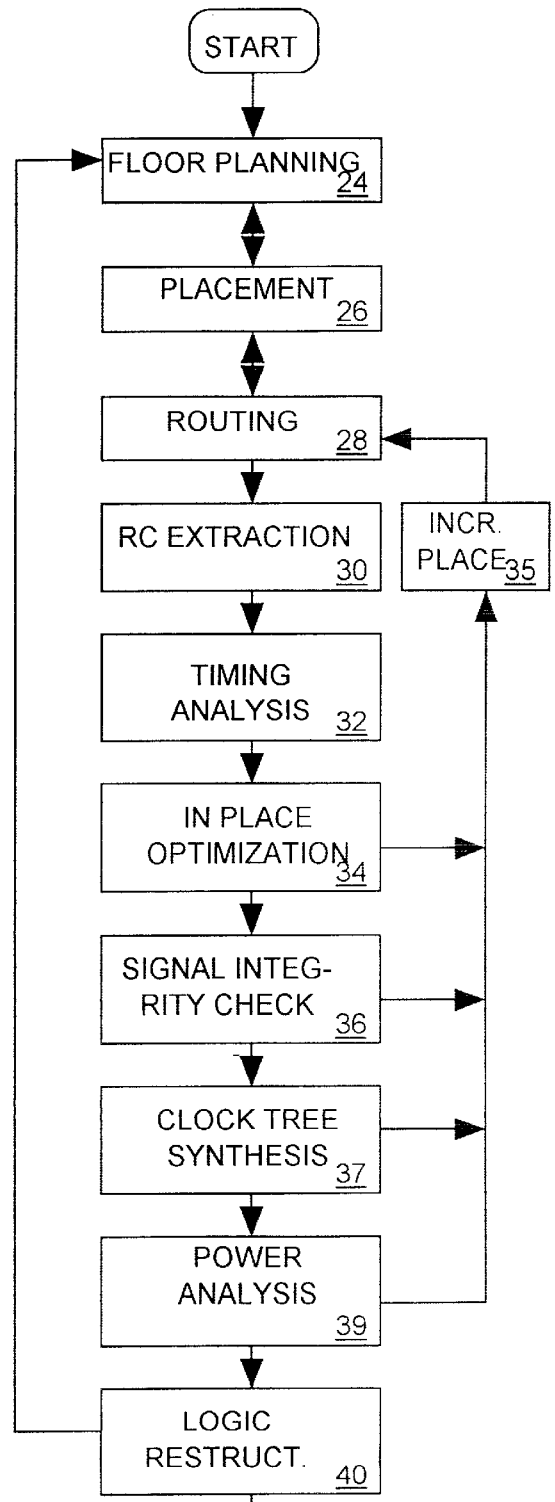
FIG. 2 is a flow chart illustrating the placement and routing step of FIG. 1 in more detail.

The present invention relates to a method for reducing cell overlap and routing congestion in an integrated circuit layout. The method is practiced by a conventional computer programmed by software stored on computer readable media. Suitable computer-readable media for storing the software include, but are not limited to, compact disks, floppy disks, hard disks, and random access or read only memory. While the specification describes exemplary embodiments and applications of the invention considered to be the best mode of practicing the invention, it is not intended that the invention be limited to the particular exemplary embodiments or applications described below.

Cell Overlap Elimination

When designing the layout of an IC, a conventional placement and routing (P&R) tool produces a placement plan specifying the position within a semiconductor substrate of each cell forming the IC and a routing plan specifying how the nets to interconnect cell terminals are to be routed. As discussed above, the P&R tool may have to modify the preliminary placement plan to insert additional cells into the design, for example, after the layout has been subjected to in place optimization or after a clock tree synthesis tool has designed a clock tree to be incorporated into the layout. Cells may also be added in response to an engineering change order. A designer may also change the size or aspect ratio of various cells in a layout.

A cell overlap problem can arise whenever the cells are to be added to a layout, or whenever a designer changes a cell's size or shape. For example, when a clock tree synthesis tool generates a clock tree design specifying that buffer cells are to be placed at particular locations within the layout, some of the buffer cells may overlap other cells. A P&R tool must therefore modify the placement plan to make room for the buffer cells at the positions specified by the clock tree design. The present invention relates to a method that may be used by a P&R tool to determine how to move cells about within the layout to eliminate cell overlap.

A typical placement and routing tool organizes the placement area of an IC substrate into a set of tiles of uniform dimension, each of which can accommodate one standard-sized "cell unit". Each cell to be placed in a substrate may be one or more cell units in size and may therefore occupy one or more tiles. A P&R tool employing the method of the present invention organizes the placement area into an array of rectangular blocks, each of which is large enough to accommodate several cell units. After cells have been added to a layout, for example following a clock tree synthesis process, the P&R tool processes the placement plan to determine how many cell units have been assigned to each block. When the number of cell units assigned to a block exceeds the blocks available space, the P&R tool reassigns the excess number of cell units to neighboring blocks. To determine how many cell units are to be moved into or out of each block from each of its neighboring blocks, the P&R tool solves a quadratic programming problem described in detail below. The solution to the quadratic programming problem tells the P&R tool how many cell units it must move between each pair of neighboring blocks to ensure that the number of cell units spanned by the cells assigned to each block remains within the capacity of that block. The method chooses a solution to the cell relocation problem that substantially minimizes disturbance to the layout by limiting the number of cells that must be moved between adjacent pairs of blocks. This minimizes the likelihood that the modification to the layout will cause the layout to violate design criteria it may have satisfied before the modification.

Figure 3:
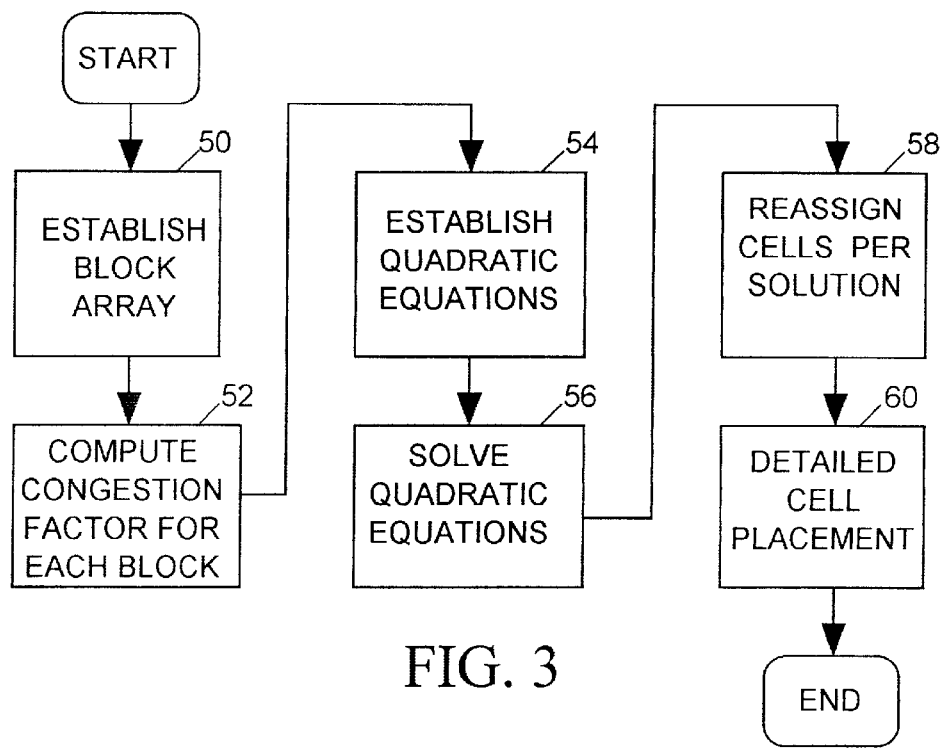
FIG. 3 is a flow chart illustrating a method in accordance with the invention for eliminating routing congestion.
Figure 4:
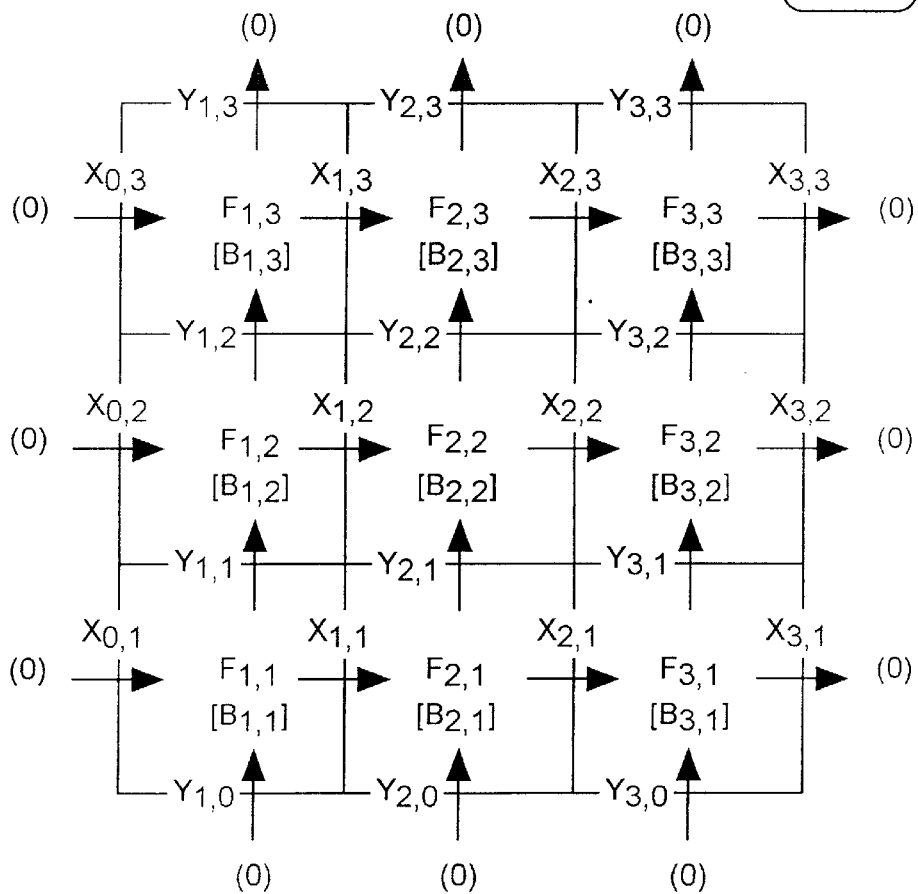
FIG. 4 is a diagram illustrating variable naming conventions employed in the equations employed by the congestion reduction method of FIG. 3.

FIG. 3 is a flow chart illustrating the method that may be practiced by a P&R tool in accordance with the invention to reduce cell overlap. As illustrated in FIG. 4, the P&R tool initially organizes the placement area into an array of rectangular blocks $B_{i,j}$ wherein the i and j subscripts denote the block's column and row within the array (step 50). Each block $B_{i,j}$ spans an area of sufficient size to hold many cell units. FIG. 4 illustrates a simple example in which a substrate area has been organized into a 3×3 array of blocks $B_{i,j}$ although in practice the block array may be much larger. The rows and columns of blocks $B_{i,j}$ need not be of uniform width as illustrated in FIG. 4 but should instead be individually sized so that any area of the substrate having a fixed layout and position occupies one or more blocks not shared with cells that may be repositioned.

As illustrated in FIG. 4, each block $B_{i,j}$ may have up to four neighbors from which it may receive cells or to which it may pass cells in order to eliminate cell overlap, depending on the block's position in the array. Thus each block $B_{i,j}$ may include a western neighbor block $B_{i-1,j}$, an eastern neighbor block $B_{i+1,j}$, a northern neighbor block $B_{i,j+1}$, and a southern neighbor block $B_{i,j-1}$.

After establishing the block array, the P&R tool computes (at step 52. FIG. 3) an "overflow factor" $F_{i,j}$ for each block $B_{i,j}$ as follows:

$$F_{i,j} = N_{i,j} - W_{i,j} * A_{i,j}.$$

where $A_{i,j}$ is the size of $B_{i,j}$ in number of cell units, $N_{i,j}$ is the total number of cell units currently assigned to block $B_{i,j}$ and $W_{i,j}$ is a weighting factor. A positive overflow factor $F_{i,j}$ indicates an estimated net number of cell units that must flow out of block $B_{i,j}$ and into its neighboring blocks in order to eliminate overlap. A negative overflow factor $F_{i,j}$ indicates an estimated maximum net number of cell units that can flow into block $B_{i,j}$ from its neighboring blocks without causing cell overlap.

Weighting factor W is a constant that may be assigned a value of 1 or less. When weighting factor $W_{i,j}$ has a value of 1, overflow factor $F_{i,j}$ simply represents the difference between the number $N_{i,j}$ of cells units assigned to the block $B_{i,j}$ and the size of the block $A_{i,j}$ in cell units. However since many cells can be more than one cell unit in size and may have varying aspect ratios, it is often not possible for a P&R tool to pack cells into a block in a way that completely fills it without cell overlap. For example adding a cell to a block that is 95% full may cause cell overlap because the block's vacant areas are so dispersed that there is no way to position all of the cells assigned to it to provide a single vacant space large enough to accommodate the cell. Hence it can be helpful to set the value of $W_{i,j}$ somewhat lower than 1 to account for the fact that a block may be subject to cell overlap problems even when the total number of cell units $N_{i,j}$ assigned to a block is less than its total cell unit capacity $A_{i,j}$. However when $W_{i,j}$ is set too low, the cell relocation process will disturb the placement more than is necessary to resolve cell overlap problems.

After computing an overflow factor $F_{i,j}$ for each block $B_{i,j}$ at step 52, the P&R tool establishes a set of equations, one for each block (step 54). For each block $B_{i,j}$ having an overflow factor $F_{i,j}$ greater than or equal to 0 ($F_{i,j} \geq 0$), the equation is $$X_{i,j} - X_{i-1,j} + Y_{i,j} - Y_{i,j-1} = F_{i,j}$$

and for each block $B_{i,j}$ having an overflow factor $F_{i,j} < 0$ the equation is $$X_{i-1,j} - X_{i,j} + Y_{i,j-1} - Y_{i,j} \leq -F_{i,j}$$

wherein $X_{i-1,j}$, is a "flow variable" representing an estimate number of cell units that are to flow into block $B_{i,j}$ from its western neighbor $B_{i-1,j}$ to reduce cell overlap, wherein $X_{i,j}$, is a flow variable representing an estimated number of cell units that are to pass from block $B_{i,j}$ to eastern neighbor $B_{i+1,j}$ to reduce cell overlap, wherein $Y_{i,j-1}$, is a flow variable representing an estimated a number of cell units that are to pass into block $B_{i,j}$ from its southern neighbor $B_{i,j-1}$ to reduce cell overlap, and wherein $Y_{i,j}$, is a flow variable representing an estimated number of cell units that are to pass from block $B_{i,j}$ to its northern neighbor $B_{i,j+1}$ to reduce cell overlap.

For blocks along the edges of the array that lack one or more of neighboring blocks, values of flow variables corresponding to its missing neighbors are set to 0 as illustrated in FIG. 4. For each block $B_{i,j}$ that is a "hard fence area" containing cells whose positions cannot be changed, values of all flow variables $X_{i-1,j}$, $X_{i,j}$, $Y_{i,j-1}$ and $Y_{i,j}$ and $F_{i,j}$ are set to zero in the above equations. This effectively eliminates the equation corresponding to the hard fence block $B_{i,j}$ because it sets all of its terms to 0, and also eliminates some of the flow variable terms of the equations corresponding to its neighboring blocks.

The P&R tool then (step 56) finds a simultaneous solution for the set of equations, thereby establishing a value for each flow variable. Many solutions are possible, but the P&R tool selects a solution that tends to minimize the disturbance to the layout in terms of the number of cells that are relocated and the distances the cells must move. The preferred approach is to choose the solution for which a sum of the squares of values of all flow variables is a minimum, but other search criteria may be used. For example the P&R tool may select the solution that minimizes the sum or average of the absolute value of flow variables, a weighted sum or average of the absolute values of the flow variable, or a weighted sum of the squares of values of the flow variable. The flow variable weighting factors may be selected, for example, to give preference to minimizing disturbances to selected areas of the layout.

Solving the above-described quadratic programming problem involves minimizing a quadratic objective function subject to both linear equality and inequality constraints. Methods for solving this type of problem are described in detail on pages 229–255 of the book *Practical Methods of Optimization* by R. Flechter published 1991 by John Wiley and Sons Ltd., incorporated herein by reference.

As discussed above, the value of each flow variable $X_{i,j}$ and $Y_{i,j}$ indicates the number of cell units that are to flow between two horizontally or vertically adjacent blocks when the layout is adjusted. The flow variable values will be positive when cell units are to move in a direction indicated by the arrows in FIG. 4 and negative when cell units are to move in the opposite direction. Once the P&R tool has solved the quadratic programming problem to find values of the X and Y variables, it reassigns the number of cell units between neighboring block indicated by the flow variable values established by the selected equation solution (step 58). Thereafter the P&R tool employs conventional cell placement techniques to generate a detailed placement plan (step 60) specifying the exact position and orientation of each cell within its assigned block.

Although the method reduces the likelihood of cell overlap problems by telling the P&R tool to decrease the cell density within various blocks, the P&R tool may find that it is still unable to find a place for every cell within the block to which it is assigned. In such case, the P&R tool may repeat the method of FIG. 3 with the weighting factors $W_{i,j}$ for the blocks still containing overlapping cells being decreased when the P&R tool computes the overflow factor for those blocks at step 52. This increases the overflow factor for each block containing overlapping cells, which in turn further reduces cell density within the block when the P&R tool subsequently reassigns and repositions cells at steps 58 and 60.

The method of FIG. 3 may therefore be iteratively repeated with the weighting factors for all block being initially set to or little less than 1 during the first iteration and with incremental reductions being made to weighting factors of blocks still having overlapping cells following each iteration, until all cell overlaps have been eliminated. Used in this manner, the method of the present invention quickly determines how to relocate cells within an existing layout to eliminate cell overlap in a manner that substantially minimizes the disturbance to the layout caused by cell relocations.

Figure 5:
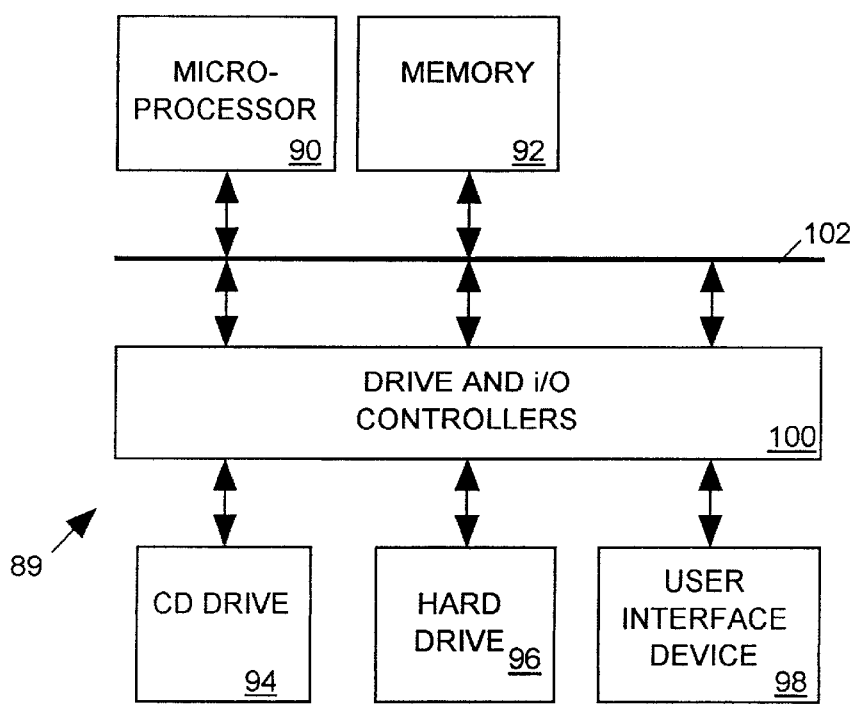
FIG. 5 is a block diagram illustrating an exemplary computer system suitable for implementing the method of FIG. 3.

FIG. 5 illustrates in block diagram form a computer 89 including a microprocessor 90, memory 92, a compact disk drive 94, a hard disk drive 96, and user interface devices communicating through drive and I/O controllers 100 and a computer bus 102. In accordance with the invention, computer 89 is programmed to carry out the method illustrated in FIG. 3, or as described below, by software stored on computer readable media accessed by processor 90 including, for example, a compact disk inserted into CD drive 94, a disc within hard disk drive 96, and memory 92. Those of skill in the art will appreciate that other computer architectures may be employed, that the software may be provided on other types of computer readable media, that the computer may access the computer readable media via a computer network, and the method may be concurrently practiced by more than one computer communicating with one another through network connections.

Routing Congestion Relief

Figure 6:
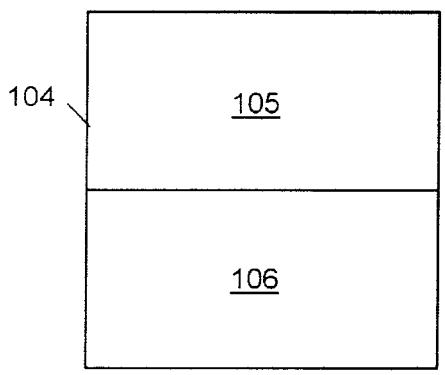
FIGS. 6–9 represent successive stages of an IC placement generated by a prior art min-cut placement algorithm.

Referring to FIG. 6, prior art P&R tools typically employ a "min-cut" placement algorithm that initially places cells in a substrate area 104 in somewhat random fashion. The algorithm then divides substrate area 104 into two partitions 105 and 106 and then determines for each cell whether moving the cell across the imaginary line between the two partitions will increase or decrease the number of nets cutting across the partition line. When the move increases the number of nets crossing the partition line, the algorithm leaves the cell in its initial partition. Otherwise when the move decreases the number of nets crossing the partition line, the algorithm reassigns the cell to the other partition.

Figure 7:
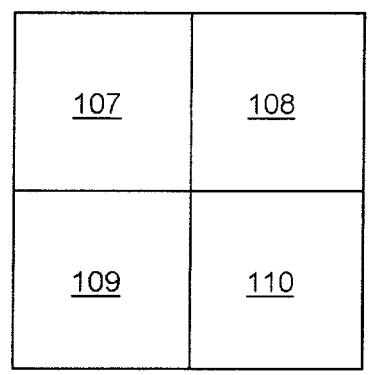
Figure 8:
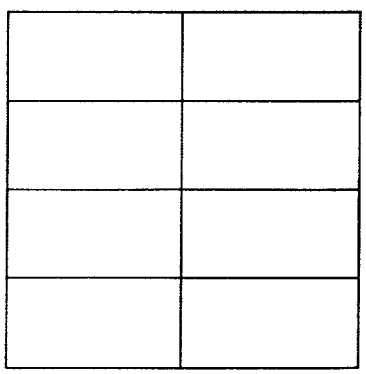
Figure 9:
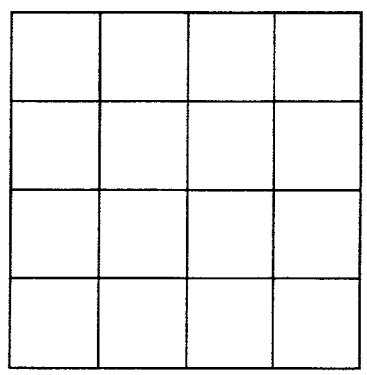

Thereafter each partition 105 and 106 becomes a "parent" partition that is itself subdivided into two smaller "child" partitions. The algorithm then reassigns the cells originally assigned to each parent partition to its children partitions in a manner that minimizes the number of nets crossing between the two child partitions. FIG. 7 shows that parent partition 105 of FIG. 6 has been divided into two children partitions 107 and 108, and that parent partition 106 has been divided into children partitions 109 and 110. The partitioning and cell placement optimization process is iteratively repeated, as illustrated in FIGS. 8 and 9, with children partitions becoming progressively smaller until they reach a predetermined minimum size. At that point a P&R tool may perform a detailed placement to specify the position and orientation of each cell within the partition to which it is assigned and thereafter develops a routing plan for that placement.

By seeking to minimize the number of nets that cross partition lines as it allocates cells between partitions, the min-cut algorithm tends to cluster highly interconnect cells near one another. This helps to reduce the lengths of the nets interconnecting the cells, and therefore helps to reduce the amount of space needed for the nets when the P&R tool subsequently routes the nets. However during the routing process, some areas of the layout can nonetheless become so congested with nets that they are unable accommodate all of the nets the P&R tool needs to route through those areas. In such case the P&R tool may have to modify the placement plan to make more room for signal paths with such areas.

Routing congestion within any particular area of a layout is related to the density of cells residing in the area. Since cells communicate with one another through nets, as the density of cells in any area of a layout increases, so too does the density of nets needed to link those cells to one another and to cells outside that area. While a min-cut algorithm helps to reduce the likelihood of routing congestion by trying to minimize path lengths, it does not directly take routing congestion into account when allocating cells between partitions. Thus, for example after dividing a parent partition into two children partitions, a min-cut algorithm would densely populate one child partition and lightly populate the other child partition when it finds that doing so minimizes the number of nets crossing partitions lines. The fact that the densely populated partition might later be subject to routing congestion plays no part in how a conventional min-cut algorithm allocates cells to the partitions.

A cell relocation method in accordance with the invention can be used to help reduce routing congestion following the placement process by reducing cell density within areas of a layout that are subject to routing congestion. The method for reducing routing congestion is substantially similar to the method illustrated in FIG. 3 for eliminating cell overlap, with the only difference being the manner in which the overflow factor $F_{i,j}$ for each block $B_{i,j}$ of the block array is computed at step 56. As described above, when the method is used to reduce cell overlap, the overflow factor $F_{i,j}$ is simply the difference between the number $N_{i,j}$ of cell units assigned to a block and the effective cell unit capacity $W_{i,j}*A_{i,j}$ of the block:

$$F_{i,j}=N_{i,j}-W_{i,j}*A_{i,j}.$$

Thus in the context of reducing cell overlap, the overflow factor $F_{i,j}$, when positive, indicates an estimated number of cell units that must flow from block $B_{i,j}$ to reduce cell overlap, and when negative, $F_{i,j}$ indicates an estimated number of cells that may flow into block $B_{i,j}$ without resulting in cell overlap.

When the method is employed to reduce routing congestion, the overflow factor $F_{i,j}$ for a block $B_{i,j}$ is computed differently so that when positive, the overflow factor indicates an estimated number of cells that must flow from the block to reduce routing congestion within the block, and when negative, it indicates an estimated number of cells that may flow into the block without causing routing congestion.

To compute overflow factor $F_{i,j}$ when the goal of the method is to reduce routing congestion, it is necessary for the P&R tool to estimate the routing congestion that is likely to occur within each block. One way to do that is to generate a trial routing plan for the entire layout. A trial routing plan routes each net between the cells it is to interconnect, but it may include routing conflicts wherein nets may overlap or cut through one another. Some conventional P&R tools initially produce such a trial routing plan and then convert the trial routing plan into a detailed routing plan by rerouting various nets plan as necessary to eliminate routing conflicts. The routing conflict resolution process may involve repositioning cells when conflicts cannot be resolved simply by rerouting nets. A P&R tool can usually generate a trial routing plan much more quickly than a detailed routing plan because the process of resolving routing conflicts typically consumes much more processing time than the process of creating the trial routing plan.

After generating a trail routing plan for a layout, a P&R tool carrying out the method of the present invention computes a "routing demand" factor $D_{i,j}$ for each block $B_{i,j}$ as the sum of the areas of the block's routing layers that are consumed by all nets within the block. Where two nets overlap, the routing area they occupy in common is added into the sum twice. The P&R tool also computes a "routing supply" factor $S_{i,j}$ for each block $B_{i,j}$ as the sum of all areas within the block available for routing. The number $N_{i,j}$ of cell units assigned to the block is also counted. The overflow factor $F_{i,j}$ for each block is then calculated as follows:

$$F_{i,j}=(D_{i,j}-W_{i,j}*S_{i,j})(N_{i,j}/D_{i,j})$$

The weighting factor $W_{i,j}$ which may range in value up to 1 may be applied to supply factor $S_{i,j}$ to determine an "effective" routing resource supply factor $W_{i,j}*S_{i,j}$ for each block $B_{i,j}$. A weighting factor $W_{i,j}$ less than 1 compensates for the fact that a P&R tool may not be able to use all of the available routing resources of a block due to an inability to pack nets into the block in a manner that does not render any routing resource unusable.

When routing demand $D_{i,j}$ exceeds the effective routing supply $W_{i,j}*S_{i,j}$, overflow factor $F_{i,j}$ is positive and indicates an estimated number of cells that must flow out of block $B_{i,j}$ and into its neighboring blocks in order to eliminate routing congestion within that block. When the effective supply factor $W_{i,j}*S_{i,j}$ exceeds the demand factor $D_{i,j}$, the overflow factor $F_{i,j}$ is negative and indicates an estimated maximum number of cells that may flow into block $B_{i,j}$ from its neighboring blocks without causing routing congestion in that block. The ratio $N_{i,j}/D_{i,j}$ reflects the notion that the current demand $D_{i,j}$ for routing resources within block $B_{i,j}$ is proportional to the number $N_{i,j}$ of cell units assigned to the block. That ratio controls the number $F_{i,j}$ of cell units that must flow out of or may flow into block $B_{i,j}$ for any particular difference between the demand $D_{i,j}$ for routing resources within the block and the block's effective supply of routing resources $W_{i,j}*S_{i,j}$. After the overflow factor $F_{i,j}$ for each block $B_{i,j}$ computed in this manner at step 52 of FIG. 3, the routing congestion process proceeds through steps 54–60.

The weighting factor $W_{i,j}$ for each block may be initially set at or close to 1. After the P&R tool subsequently modifies the placement plan in accordance with the equation solution, routing congestion problems may still arise in some blocks during the routing process, though they will not be as severe as they were before the placement plan modification. In such case, the method may be iteratively repeated with the weighting factors $W_{i,j}$ of congested blocks being incrementally reduced with each iteration so as to further decrease cell density within those blocks. The method will normally eliminate routing congestion in all blocks with few such iterations.

Congestion Driven Placement

As mentioned above, since a conventional min-cut placement algorithm does not take routing congestion into account when placing cells in an IC layout, routing congestion problems frequently arise following cell placement. However a conventional min-cut placement algorithm can be adapted to take routing congestion into account by making the routing congestion reduction method described above an integral part of successive iterations of the placement algorithm.

Figure 10:
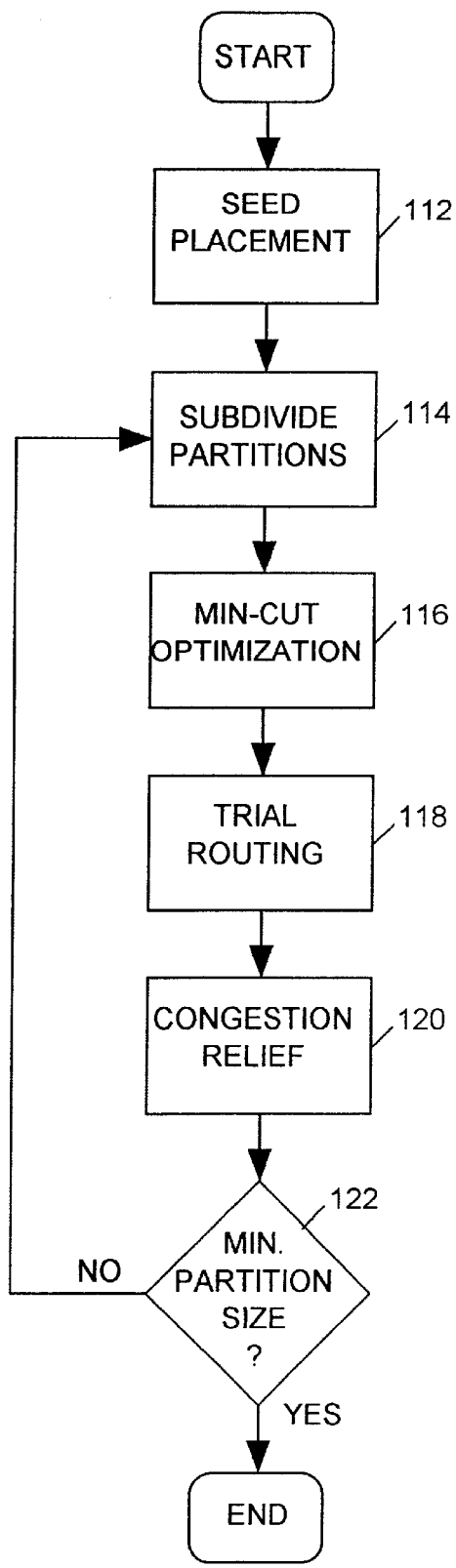
FIG. 10 illustrates an IC placement algorithm providing congestion reduction in accordance with the invention.

FIG. 10 illustrates a min-cut placement algorithm modified to incorporate the congestion relief method in accordance with the invention. FIGS. 11–14 illustrate successive stages of the placement process carried out by the algorithm of FIG. 10. At step 112 the algorithm generates a "seed placement" in which the cells may be randomly distributed in the layout. As illustrated in FIG. 11, the placement area is then subdivided into two partitions $B_{1,1}$ and $B_{1,2}$ (step 114) and a min-cut optimization process is carried out (step 116) in which the algorithm re-allocates cell assignments between partitions in an attempt to minimize the number of nets that must pass between partitions.

Thereafter (step 118) a trial routing plan is generated based on the current state of the placement plan. The above-described congestion relief method is then carried out at step 120 wherein partitions $B_{1,1}$ and $B_{1,2}$ become the blocks of the block array and wherein the routing overflow factor $F_{i,j}$ for each block is based on the trial routing carried out at step 118. During congestion relief step 120, when the solution to the equations indicates that a number of cell units must be moved from one of blocks $B_{1,1}$ and $B_{1,2}$ to the other, the P&R tool selects the particular cells to be moved so as to minimize the number of nets that cross partition lines.

When the partition size is above a target minimum size (step 122) the algorithm returns to step 114 and again subdivides the partitions. Thus partition $B_{1,1}$ of FIG. 11 is subdivided to become two smaller partitions $B_{1,1}$ and $B_{2,1}$ as illustrated in FIG. 12, and partition $B_{1,2}$ of FIG. 11 is subdivided to become smaller partitions $B_{1,2}$ and $B_{2,2}$ of FIG. 12. The min-cut optimization process is repeated at step 116 to move cells between partitions $B_{1,1}$ and $B_{2,1}$ and to move cell between $B_{1,2}$ and $B_{2,2}$ so as to reduce the number of nets crossing partition lines. After a new trial routing plan is generated at step 118, the congestion relief process is repeated at step 120. During step 120 cells may be shifted from any one of partitions $B_{1,1}$–$B_{2,2}$ to any of its neighboring partitions. The algorithm continues to loop through steps 114–122 subdividing the layout into progressively smaller partitions as illustrated in FIGS. 12–14, until the process ends when partition size reaches the target minimum size at step 122.

In alternative embodiments of the placement algorithm, the trial routing and congestion relief steps 118 and 120 may be carried out only during every Nth iteration of the placement process where N may be a number larger than 1. Setting N larger than 1 can improve the speed of the layout process by reducing the number of times the algorithm must carry out the trial routing and congestion relief steps. However setting N too large can compromise the ability of the algorithm to prevent routing congestion.

Thus have been shown and described a method and apparatus in accordance with the invention that may be employed to eliminate overlapping cell placements in an IC layout, to eliminate routing congestion in an IC layout, or to generate a placement plan in a way that reduces the possibility of routing congestion. The forgoing specification and the drawings depict exemplary embodiments of the best mode(s) of practicing the invention, and elements or steps of the depicted best mode(s) exemplify the elements or steps of the invention as recited in the appended claims. However the appended claims are intended to broadly apply to any mode of practicing the invention comprising the combination of elements or steps as described in any one of the claims, including elements or steps that are functional equivalents of the example elements or steps of the exemplary embodiment (s) of the invention depicted in the specification and drawings.

What is claimed is:

1. A method for modifying an integrated circuit (IC) layout for an IC design describing the IC as being formed by cells interconnected by nets, wherein each cell is an integer number of cell units in area, and wherein the layout specifies a position for each cell within a semiconductor substrate upon which the IC is to be formed, the method comprising the steps of:

a. organizing the layout into an array rows and columns of blocks, such that each block $B_{i,j}$ residing at the intersection of an ith column and the jth row has at least one neighboring block, wherein each block $B_{i,j}$ is sufficiently large in area to hold a plurality of cells;

b. computing a separate overflow factor $F_{i,j}$ corresponding to each block $B_{i,j}$;

c. establishing a plurality of equations, wherein each block $B_{i,j}$ corresponds to a separate one of the equations, wherein the equation corresponding to each block $B_{i,j}$ relates a plurality of flow variables to the overflow factor $F_{i,j}$ corresponding to that block $B_{i,j}$, wherein each flow variable of the equation corresponding to each block $B_{i,j}$ corresponds to a separate one of that block's neighboring blocks and represents a direction and number of cell units that are to flow between the block and the corresponding neighboring block as layout is altered; and d. selecting a simultaneous solution to the plurality of equations that establishes values of their flow variables.

2. The method in accordance with claim 1 further comprising the step of:

e. modifying the layout to move a number of cell units between neighboring blocks as indicated by the flow variable values established by the solution selected at step d.

3. The method in accordance with claim 1 wherein for each block $B_{i,j}$ having four neighboring blocks and for which overflow factor $F_{i,j} \geq 0$, the equation established at step c is consistent with the relationship $$X_{i,j} - X_{i-1,j} + Y_{i,j} - Y_{i,j-1} = F_{i,j}$$

and wherein for each block $B_{i,j}$ having four neighboring blocks for which overflow factor $F_{i,j} < 0$, the equation established at step c is consistent with the relationship $$X_{i1,j} - X_{i,j} + Y_{i,j1} - Y_{i,j}21 = -F_{i,j}$$

wherein $X_{i-1,j}$, is a flow variable representing a number of cell units that are to flow between blocks $B_{1,j}$ and $B_{i-1,j}$, wherein $X_{i,j}$, is a flow variable representing a number of cell units that are to flow between block $B_{i,j}$ and its neighboring block $B_{i-1,j}$, wherein $Y_{i,j-1}$, is a flow variable representing a number of cell units that are to flow between block $B_{i,j}$ and its neighboring black $B_{i,j+1}$, and wherein $Y_{i,j}$, is a flow variable representing a number of cell units that are to flow between block $B_{i,j}$ and its neighboring block $B_{i,j+1}$.

4. The method in accordance with claim 3 further comprising the step of:

c. modifying the layout to move a number of cell units between neighboring blocks indicated by each flow variable value established at step d.

5. The method in accordance with claim 1 wherein overflow factors $F_{i,j}$ computed at step b for some of blocks $B_{i,j}$ represent an estimated number of cell units that must flow out of their corresponding blocks $B_{i,j}$ to eliminate cell overlap in the corresponding blocks, and wherein overflow factors $F_{i,j}$ computed at step b for others of block $B_{i,j}$ represent an estimated number of cell units that may flow into their corresponding blocks $B_{i,j}$ without causing cell overlap in their corresponding blocks $B_{i,j}$.

6. The method in accordance with claim 1 wherein the overflow factor $F_{i,j}$ corresponding to each block $B_{i,j}$ is computed at step c in accordance with the relation:

$$F_{i,j} = N_{i,j} - W_{i,j} * A_{i,j}$$

wherein $N_{i,j}$ is a number of cell units included in cells residing in block $B_{i,j}$, wherein $A_{i,j}$ represents a cell unit capacity of block $B_{i,j}$ and wherein $W_{i,j}$ has any value $1 \geq W_{i,j} > 0$.

7. The method in accordance with claim 1 wherein overflow factors $F_{i,j}$ computed at step b for some of blocks $B_{i,j}$ indicate an estimated number of cell units that must flow out of their corresponding blocks $B_{i,j}$ to eliminate routing congestion of nets within the corresponding blocks $B_{i,j}$, and wherein the overflow factors $F_{i,j}$ computed at step b for others of blocks $B_{i,j}$ indicate an estimated number of cell units that may flow into their corresponding blocks $B_{i,j}$ without causing routing congestion of nets within in their corresponding blocks $B_{i,j}$.

8. The method in accordance with claim 7 wherein the overflow factor $F_{i,j}$ corresponding to each block $B_{i,j}$ is computed at step c in accordance with the relation:

$$F_{i,j} = (D_{i,j} - W_{i,j} * S_{i,j})(N_{i,j}/D_{i,j})$$

wherein $D_{i,j}$ represents an estimated demand for area within block $B_{i,j}$ for routing nets, wherein $S_{i,j}$ represents an available area within block $B_{i,j}$ for routing nets, wherein $N_{i,j}$ represents a total number of cell units of cells residing within the corresponding block, and wherein $W_{i,j}$ is a constant having any value $1 \geq W_{i,j} > 0$.

9. The method in accordance with claim 8 further comprising the step of:

e. modifying the layout to move cell units between neighboring blocks as indicated by the flow variable values established at step d.

10. The method in accordance with claim 1 wherein the solution selected at step d is selected from among a plurality of solutions because it optimizes a function of values of the flow variables included in the equations corresponding to the blocks.

11. The method in accordance with claim 1 wherein the solution selected at step d is selected from among a plurality of solutions because it minimizes a sum of squares of values of the flow variables included in the equations corresponding to the blocks.

12. The method in accordance with claim 1 wherein the solution selected at step d is selected from among a plurality of solutions because it minimizes a weighted sum of squares of values of the flow variables included in the equations corresponding to the blocks.

13. A method for generating an integrated circuit (IC) layout for an IC design describing the IC as being formed by cells interconnected by nets, wherein each cell is an integer number of cell units in size, wherein a cell unit is a unit of area, wherein the IC layout specifies a position for each cell within a semiconductor substrate upon which the IC is to be formed, the method comprising the steps of:

a. generating a layout specifying a position of each cell described by the IC design;

b. dividing the layout into a plurality of partitions;

c. relocating cells between the partitions to reduce a number of nets that must pass between the partitions;

d. computing a plurality of overflow factors, each corresponding to a separate one of the partitions, wherein some of the overflow factors indicate an estimated number of cell units that must be removed from their corresponding partitions to eliminate routing congestion of nets within the corresponding blocks, and wherein others of the overflow factors indicate an estimated additional number of cell units that may be placed in their corresponding partitions without causing routing congestion of nets within in their corresponding partitions;

e. establishing a plurality of equations, wherein each partition corresponds to a separate one of the equations, wherein the equation corresponding to each partition relates a plurality of flow variables to the overflow factor corresponding to that partition, wherein each flow variable of the equation corresponding to each partition corresponds to a separate one of that partition's neighboring partitions and represents a direction and number of cell units that are to be moved between the partition and the corresponding neighboring partition;

f. selecting a simultaneous solution to the plurality of equations establishing values of their flow variables; and g. modifying the layout to move a number of cell units between neighboring partitions as indicated by the flow variable values established by the solution selected at step f.

14. The method in accordance with claim 13 further comprising the step of subdividing the partitions into smaller partitions and then repeating steps c–e with respect to the smaller partitions.

15. The method in accordance with claim 13 wherein the overflow factor F corresponding to each partition is computed at step d in accordance with the relation:

$$F=(D-W*S)(N/D)$$

wherein D represents an estimated demand for area within the corresponding partition for routing nets, wherein S represents an available area within the corresponding partition for routing nets, wherein N represents a total number of cell units of cells residing within the partition, and wherein W has any value 1>=W>0.

16. The method in accordance with claim 13 wherein the solution selected at step f is selected from among a plurality of solutions because it optimizes a function of values of the flow variables included in the equations corresponding to the partitions.

17. The method in accordance with claim 13 wherein the solution selected at step f is selected from among a plurality of solutions because it minimizes a sum of squares of values of the flow variables included in the equations corresponding to the partitions.

18. The method in accordance with claim 13 wherein the solution selected at step f is selected from among a plurality of solutions because it minimizes a weighted sum of squares of values of the flow variables included in the equations corresponding to the blocks.

19. Computer readable media storing software which when executed by a computer causes the computer to carry out a method for modifying an integrated circuit (IC) layout for an IC design describing the IC as being formed by cells interconnected by nets, wherein each cell is an integer number of cell units in size, wherein the IC layout specifies a position for each cell within a semiconductor substrate upon which the IC is to be formed, wherein the method comprises the steps of:

a. organizing the layout into an array rows and columns of blocks, such that each block $B_{i,j}$ residing at the intersection of an ith column and the jth row has at least one neighboring block, and wherein each block $B_{i,j}$ has capacity to hold a plurality of cells;

b. computing a separate overflow factor $F_{i,j}$ corresponding to each block $B_{i,j}$;

c. establishing a plurality of equations, wherein each block $B_{i,j}$ corresponds to a separate one of the equations, wherein the equation corresponding to each block relates a plurality of flow variables to the overflow factor $F_{i,j}$ corresponding to that block $B_{i,j}$, wherein each flow variable of the equation corresponding to each block $B_{i,j}$ corresponds to a separate one of that block's neighboring blocks and represents a direction and number of cell units that are to flow between the block $B_{i,j}$ and the corresponding neighboring block; and d. selecting a simultaneous solution to the plurality of equations that establishes values of their flow variables.

20. The computer readable media in accordance with claim 19 wherein the method further comprises the step of:

e. modifying the layout to move a number of cell units between neighboring pairs of blocks as indicated by the flow variable values established by the solution selected at step d.

21. The computer readable media in accordance with claim 19 wherein for each block $B_{i,j}$ having four neighboring blocks and for which overflow factor $F_{i,j}>=0$, the equation established at step c is consistent with the relationship $$X_{i,j}-X_{i-1,j}+Y_{i,j}-Y_{i,j-1}=F_{i,j}$$

and wherein for each block $B_{i,j}$ having four neighboring blocks for which overflow factor $F_{i,j}<0$, the equation established at step c is consistent with the relationship $$X_{i-1,j}-X_{i,j}+Y_{i,j-1}-Y_{i,j}<=-F_{i,j}$$

wherein $X_{i-1,j}$, is a flow variable representing a number of cell units that are to flow between blocks $B_{i,j}$ and $B_{i-1,j}$, wherein $X_{i,j}$, is a flow variable representing a number of cell units that are to flow between block $B_{i,j}$ and its neighboring block $B_{i+1,j}$, wherein $Y_{i,j-1}$, is a flow variable representing a number of cell units that are to flow between block $B_{i,j}$ and its neighboring block $B_{i,j-1}$, and wherein $Y_{i,j}$, is a flow variable representing a number of cell units that are to flow between block $B_{i,j}$ and its neighboring block $B_{i,j+1}$.

22. The computer readable media in accordance with claim 21 wherein the method further comprises the step of:

e. modifying the layout to move cell units between neighboring blocks as indicated by the flow variable values established at step d.

23. The computer readable media in accordance with claim 19 wherein overflow factors $F_{i,j}$ computed at step b corresponding to some of blocks $B_{i,j}$ represent an estimated number of cell units that must flow out of their corresponding blocks $B_{i,j}$ to eliminate cell overlap in the corresponding blocks, and wherein overflow factors $F_{i,j}$ computed at step b corresponding to others of blocks $B_{i,j}$ represent an estimated number of cell units that may flow into their corresponding blocks $B_{i,j}$ without causing cell overlap in their corresponding blocks $B_{i,j}$.

24. The computer readable media in accordance with claim 19 wherein the overflow factor $F_{i,j}$ corresponding to each block $B_{i,j}$ is computed at step c consistent with the relation:

$$F_{i,j}=N_{i,j}-W_{i,j}*A_{i,j},$$

wherein $N_{i,j}$ is a number of cell units included in cells residing in block $B_{i,j}$, wherein $A_{i,j}$ represents a cell unit capacity of block $B_{i,j}$, and wherein $W_{i,j}$ is a constant having any value $1>=W_{i,j}>0$.

25. The computer readable media in accordance with claim 19 wherein overflow factors $F_{i,j}$ computed at step b corresponding to some of blocks $B_{i,j}$ indicate an estimated number of cell units that must flow out of their corresponding blocks $B_{i,j}$ to eliminate routing congestion of nets within the corresponding blocks, and wherein overflow factors $F_{i,j}$ computed as step b corresponding to others of blocks $B_{i,j}$ indicate an estimated number of cell units that may flow into their corresponding blocks $B_{i,j}$ without causing routing congestion of nets within in their corresponding blocks $B_{i,j}$.

26. computer readable media in accordance with claim 25 wherein the overflow factor $F_{i,j}$ corresponding to each block $B_{i,j}$ is computed at step c consistent with the relation:

$$F_{i,j}=(D_{i,j}-W_{i,j}*S_{i,j})(N_{i,j}/D_{i,j})$$

wherein $D_{i,j}$ represents an estimated demand for area within block $B_{i,j}$ for routing nets, wherein $S_{i,j}$ represents an available area within block $B_{i,j}$ for routing nets, wherein $N_{i,j}$ represents a total number of cell units of cells residing within the corresponding block, and wherein $W_{i,j}$ is a constant having any value $1>=W_{i,j}>0$.

27. The computer readable media in accordance with claim 26 wherein the method further comprises the step of:

e. modifying the layout to move cell units between neighboring pairs of blocks as indicated by the flow variable values established at step d.

28. The computer readable media in accordance with claim 19 wherein the solution selected at step d is selected from among a plurality of solutions because it optimizes a function of values of the flow variables included in the equations corresponding to the blocks.

29. The computer readable media in accordance with claim 19 wherein the solution selected at step d is selected from among a plurality of solutions because it minimizes a sum of squares of values of the flow variables included in the equations corresponding to the blocks.

30. The computer readable media in accordance with claim 19 wherein the solution selected at step d is selected from among a plurality of solutions because it minimizes a weighted sum of squares of values of the flow variables included in the equations corresponding to the blocks.

31. Computer readable media storing software which when executed by a computer causes the computer to carry out a method for generating an integrated circuit (IC) layout for an IC design describing the IC as being formed by cells interconnected by nets, wherein each cell is an integer number of cell units in size, wherein a cell unit is a unit of area, wherein the IC layout specifies a position for each cell within a semiconductor substrate upon which the IC is to be formed, wherein the method comprises the steps of:

a. generating a layout specifying a position of each cell described by the IC design;

b. dividing the layout into a plurality of partitions;

c. relocating cells between the partitions to reduce a number of nets that must pass between the partitions;

d. computing a plurality of overflow factors, each corresponding to a separate one of the partitions, wherein some of the overflow factors indicate an estimated number of cell units that must be removed from their corresponding partitions to eliminate routing congestion of nets within the corresponding blocks, and wherein others of the overflow factors indicate an estimated additional number of cell units that may be placed in their corresponding partitions without causing routing congestion of nets within in their corresponding partitions, e. establishing a plurality of equations, wherein each partition corresponds to a separate one of the equations, wherein the equation corresponding to each partition relates a plurality of flow variables to the overflow factor corresponding to that partition, wherein each flow variable of the equation corresponding to each partition corresponds to a separate one of that partition's neighboring partitions and represents a direction and number of cell units that are to be moved between the partition and the corresponding neighboring partition;

f. selecting a simultaneous solution to the plurality of equations establishing values of their flow variables; and g. modifying the layout to move a number of cell units between neighboring partitions as indicated by the flow variable values established by the solution selected at step f.

32. The computer-readable media in accordance with claim 31 wherein the method further comprises the step of subdividing the partitions into smaller partitions and then repeating steps c–e with respect to the smaller partitions.

33. The computer-readable media in accordance with claim 31 wherein the overflow factor F corresponding to each partition is computed at step d in accordance with the relation:

$$F=(D-W*S)(N/D)$$

wherein D represents an estimated demand for area within the corresponding partition for routing nets, wherein S represents an available area within the corresponding partition for routing nets, wherein N represents a total number of cell units of cells residing within the partition, and wherein W has any value $1>=W>0$.

34. The computer-readable media in accordance with claim 31 wherein the solution selected at step f is selected from among a plurality of solutions because it optimizes a function of values of the flow variables included in the equations corresponding to the partitions.

35. The computer-readable media in accordance with claim 31 wherein the solution selected at step f is selected from among a plurality of solutions because it minimizes a sum of squares of values of the flow variables included in the equations corresponding to the partitions.

36. The computer-readable media in accordance with claim 31 wherein the solution selected at step f is selected from among a plurality of solutions because it minimizes a weighted sum of squares of values of the flow variables included in the equations corresponding to the blocks.

* * * * *

UNITED STATES PATENT AND TRADEMARK OFFICE
CERTIFICATE OF CORRECTION

PATENT NO. : 6,668,365 B2
DATED : December 23, 2003
INVENTOR(S) : Ywh-Pyng Harn

It is certified that error appears in the above-identified patent and that said Letters Patent is hereby corrected as shown below:

Column 13,
Line 25, delete "$X_{i\ 1,j}-X_{i,j}+Y_{i,j\ 1}-Y_{i,j}21=-F_{i,j}$" and replace with
-- $X_{i-1,j}-X_{i,j}+Y_{i,j-1}-Y_{i,j}<=-F_{i,j}$ --.
Line 30, delete "$B_{i-1,j}$" and replace with -- $B_{i+1,j}$ --.
Line 33, delete "$B_{i,j+1}$" and replace with -- $B_{i,j-1}$ --.

Column 16,
Line 28, delete "$X_{i-1,j}-X_{i,j}+Y_{i,j\ 1}-Y_{i,j}<=-F_{i,j}$" and replace with
-- $X_{i-1,j}-X_{i,j}+Y_{i,j-1}-Y_{i-j}<=-F_{i,j}$ --.
Line 31, "$B_{i\ 1,j}$" and replace with -- $B_{i-1,j}$ --.

Column 17,
Line 20, delete "$F_{i,j}=(D_{i,j}=W_{i,j}*S_{i,j})\ (N_{i,j}/D_{i,j})$" and replace with
-- $F_{i,j}=(D_{i,j}-W_{i,j}*S_{i,j})\ (N_{i,j}/D_{i,j})$ --.

Signed and Sealed this

Thirtieth Day of May, 2006

JON W. DUDAS
*Director of the United States Patent and Trademark Office*